(12) United States Patent
Bingo

(10) Patent No.: US 7,844,872 B2
(45) Date of Patent: Nov. 30, 2010

(54) SEMICONDUCTOR DEVICE

(75) Inventor: Takeshi Bingo, Tokyo (JP)

(73) Assignee: Renesas Electronics Corporation, Kawasaki (JP)

( * ) Notice: Subject to any disclaimer, the term of this patent is extended or adjusted under 35 U.S.C. 154(b) by 186 days.

(21) Appl. No.: 12/272,173

(22) Filed: Nov. 17, 2008

(65) Prior Publication Data

US 2009/0193302 A1    Jul. 30, 2009

(30) Foreign Application Priority Data

Jan. 29, 2008    (JP) .............................. 2008-017224

(51) Int. Cl.
*G01R 31/28*    (2006.01)
(52) U.S. Cl. ...................................... 714/733; 714/723
(58) Field of Classification Search ................ 365/201; 702/57; 714/718, 724, 733, 723
See application file for complete search history.

(56) References Cited

U.S. PATENT DOCUMENTS 5,946,250 A * 8/1999 Suzuki ....................... 365/201

| | | | |
|---|---|---|---|
| 6,173,238 B1 | 1/2001 | Fujisaki | 702/117 |
| 6,374,378 B1 * | 4/2002 | Takano et al. | 714/719 |
| 7,634,695 B2 * | 12/2009 | Doi | 714/711 |
| 2008/0052015 A1 * | 2/2008 | Ozawa et al. | 702/57 |
| 2008/0215939 A1 * | 9/2008 | Ahn et al. | 714/719 |

FOREIGN PATENT DOCUMENTS

| | | |
|---|---|---|
| JP | 10-55694 | 2/1998 |
| JP | 11-16393 | 1/1999 |
| JP | 2006-138645 | 6/2006 |

* cited by examiner

*Primary Examiner*—David Ton
(74) *Attorney, Agent, or Firm*—Mattingly & Malur, P.C.

(57) ABSTRACT

A semiconductor device capable of reducing a memory area of a test circuit required for storing fail-information is provided. In the test circuit, for determining right/wrong of information obtained by memory access, specific fail-information among pieces of fail-information sequentially obtained in response to wrong-determination result is held in a first memory section; and differences in serial two pieces of fail-information sequentially continuing from the specific fail-information are held in a second memory section. The test circuit, when it obtains differences based on pieces of fail-information sequentially obtained with a wrong-determination result at the time of holding the specific fail-information as a base point, sequentially adds subsequent differences to the specific fail-information to decompress subsequent pieces of fail-information.

21 Claims, 13 Drawing Sheets

SEMICONDUCTOR DEVICE

CROSS-REFERENCE TO RELATED APPLICATION

The present application claims priority from Japanese patent application No. 2008-17224 filed on Jan. 29, 2008, the content of which is hereby incorporated by reference into this application.

BACKGROUND OF THE INVENTION

The present invention relates to a semiconductor device which includes a test circuit such as a BIST (built in self test) circuit for testing a memory, and to a technique which is useful for a system-on-chip type semiconductor device and further a system-in-package type semiconductor device mounting the system-on-chip type data processor chip and a memory chip.

The following publicly known documents are found out in the prior art investigation conducted after completion of the present invention. In Japanese Patent Laid-open No. 2006-138645, a semiconductor device having an operation mode in which a logic and a memory mounted on a single package are tested by the BIST circuit, is described. In Japanese Patent Laid-open No. 11-16393, a test circuit is described, which memorizes positional information of a failure in a semiconductor having a self-diagnosis circuit and a built-in memory when the failure is detected in the semiconductor, and compresses the information to output it. In Japanese Patent Laid-open No. 10-55694, in a test of a DRAM such as a galloping mode test, a technique is described, in which a plurality of times of the same address errors is compressed at a compression section to reduce writing frequency of fail data.

SUMMARY OF THE INVENTION

Previously, inventors of the present invention considered with regard to self-test function of a memory in a semiconductor device such as a data processor which can control access to a memory. A test for a memory chip which is mounted on a data processor or a single module memory which is packaged together with the data processor can also be performed by causing the CPU of the data processor to execute a test program via a memory controller. In order to perform a various kinds of memory tests by this approach, the specification of the memory controller must be clear. When a memory controller is designed according to a customer's specification or a memory controller directly using a design property such as a so-called IP (intellectual property) module is adopted, since the specification of the memory controller is not clear, a memory test using the memory controller is forced to be restricted functionally. In consideration of these circumstances, in order to reduce the cost of a test design, it is useful for a memory test to adopt a BIST circuit. With regard to this point of view, the inventors of the present invention have filed a patent application as Japanese Patent Laid-open No. 2007-107772 (filed April 17, Heisei 19) previously, and it is not described in any of the above-mentioned patent documents.

The inventors of the present invention have investigated a BIST where a plurality of pieces of fail-information such as fail memory data and fail memory address can be obtained by an operation of a memory test. In Japanese Patent Laid-open No. 11-16393, upon output of fail-information, time required for outputting information to a tester is intended to be reduced by compressing information, but, the approach does not contribute to reduction of a memory area for holding the fail-information. In Japanese Patent Laid-open No. 10-55694, only frequency for writing fail data in a failure analysis memory is reduced by compressing fail data according to a plurality of errors occurred for a single address. In any of the patent documents, there is a limitation to reduce a memory area (fail memory area) required for storing fail-information that is obtained by a memory test. If fail data collected by one memory test cannot be held, it is necessary to divide the memory test to a plurality of steps, resulting in decrease of efficiency of the test. Furthermore, since, for a fail due to noise, an address where the fail occurs may change for each time of measurement, it is also considered that dividing the memory test to the steps makes it difficult to grasp the state of the fail due to noise.

An object of the present invention is to provide a semiconductor device capable of reducing a memory area of a test circuit required for storing fail-information.

The above and further objects and novel features of the present invention will more fully appear from the following detailed description in this specification and the accompanying drawings.

Preferred embodiments of the present invention which will be described herein are briefly outlined beneath.

That is, in a test circuit for determining right/wrong of information obtained by memory access, specific fail-information among pieces of fail-information sequentially obtained in response to a wrong-determination result and differences in serial two pieces of fail-information sequentially continuing from the specific fail-information are held.

The effect brought about by preferred embodiments of the present invention is briefly described as follows.

That is, the memory area of a test circuit required for storing fail-information can be reduced.

DETAILED DESCRIPTION OF THE PREFERRED EMBODIMENTS

1. Outline of Embodiments

Figure 1:
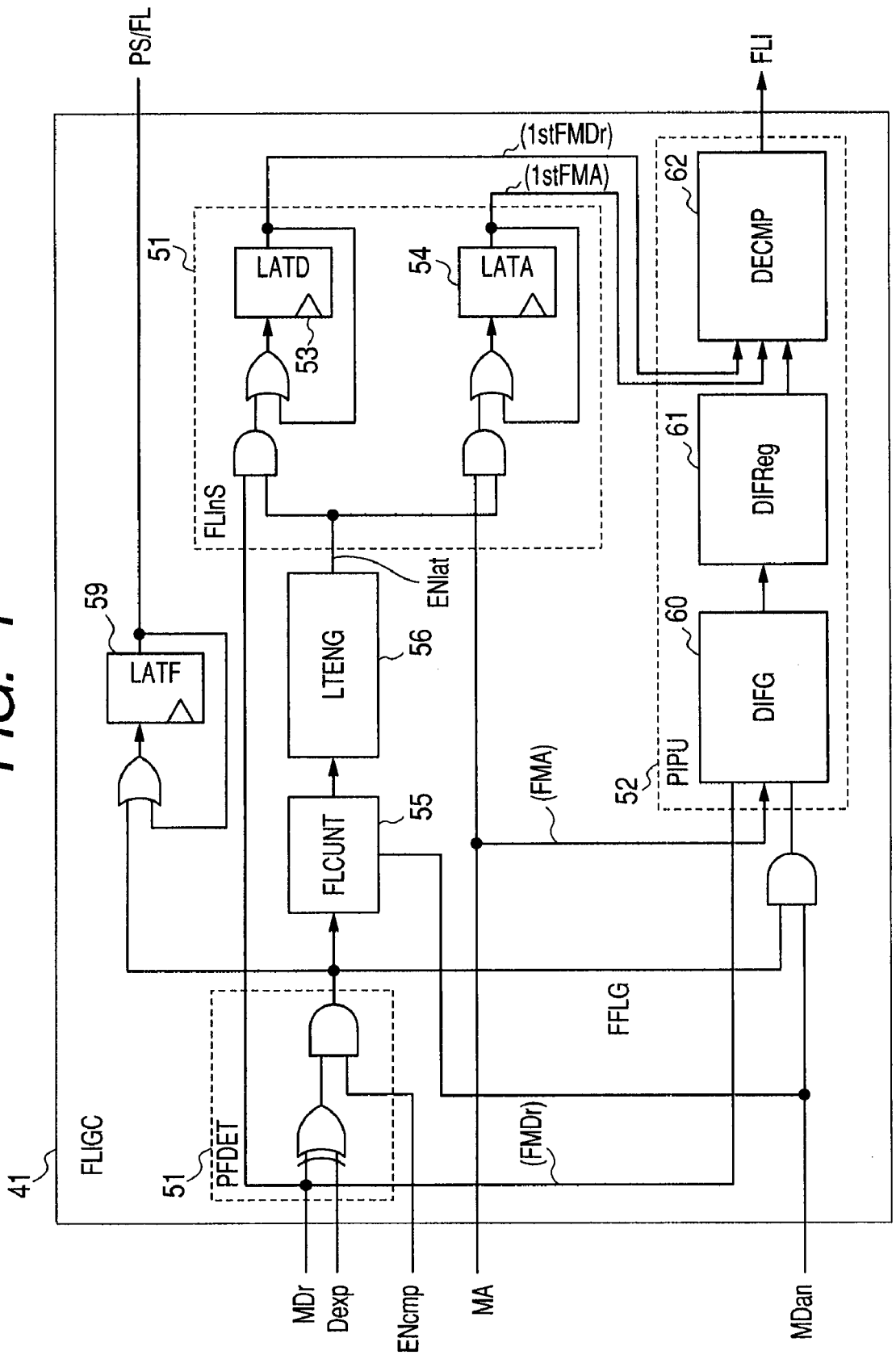
FIG. 1 is a block diagram showing a specific example of a fail-information obtaining circuit.

Firstly, preferred embodiments of the present invention which will be disclosed herein are briefly outlined below. Reference symbols and numerals in the accompanying drawings indicated in parenthesis in the brief description of the representative embodiments are mere exemplifications of components within a scope of constituting elements to which the symbols and numerals are given.

(1) A semiconductor device according to the present invention includes a test circuit (20). The test circuit determines right/wrong of information obtained by memory access, and holds specific fail-information (1st FMA and 1st FMDr) among pieces of fail-information sequentially obtained in response to a wrong-determination result and differences in fail-information between serial two pieces of fail-information sequentially continuing from the specific fail-information. Since, the differences with respect to the serial two pieces of fail-information are held, a memory area of the test circuit required for storing the fail-information can be reduced.

(2) In Paragraph 1, for example, the test circuit, when it obtains differences based on pieces of fail-information sequentially obtained with a wrong-determination result at the time of holding the specific fail-information as a base point, sequentially adds subsequent differences to the specific fail-information to decompress subsequent pieces of fail-information. This enables the order of decompression of fail-information to be an ascending order (order of occurrence of the fail-information). On the other hand, when as reference fail-information for being added to difference to decompress fail-information, fail-information used for obtaining the last difference is used, decompression of fail-information will be performed by adding differences to the reference information, which sequentially continue in the tracing direction to the base point of the fail-information, and thereby the order of decompression of fail-information will be a descending order.

(3) In Paragraph 1, for example, the fail-information includes memory data and memory addresses corresponding to the data, which are read from a memory. In some cases, the fail-information can include only any one of them.

(4) In Paragraph 3, for example, the test circuit separates the memory data and the memory addresses included in the fail-information; and obtains differences in each separated fail-information. In a memory test, in some cases, the factor of occurrence of a fail or the tendency of a fail may differ largely between the addresses and the data.

(5) In Paragraph 4, for example, the test circuit divides the memory data and the memory addresses included in serial two pieces of fail-information sequentially continuing from the specific fail-information into a plurality of groups, respectively, and obtains differences for each corresponding group and holds them. Therefore, whether or not a partially coinciding part is present between pieces of fail-information from which difference is taken can be grasped for each group.

(6) In Paragraph 5, for example, the test circuit generates group information (GrINF) which defines correspondence of a difference in fail-information obtained by dividing it into groups and a corresponding group, and removes pieces of difference information of groups having zero difference from objects to be held. Therefore, the memory area required for storing fail-information can be reduced further. The groups removed from the objects to be held will be clear from group-information dropped by this procedure.

(7) In Paragraph 6, the test circuit, when it obtains differences based on pieces of fail-information sequentially obtained with a wrong-determination result at the time of holding the specific fail-information as a base point, sequentially adds subsequent differences to the specific fail-information for each corresponding group to decompress subsequent pieces of fail-information.

(8) In Paragraph 7, the test circuit, when it performs the decompression, matches objects to be added of each group based on the group information.

(9) In Paragraph 1, for example, the semiconductor device further includes a test interface circuit for coupling the test circuit to a tester. Data input/output speed of the test interface circuit is slower than memory access speed by the test circuit. If a memory area for storing fail-information is provided, there is no problem even if such speed difference is present.

(10) In Paragraph 9, for example, the test circuit further includes a control circuit for accessing a memory. Since the test circuit is provided, it is not necessary to divert the control circuit for a test.

(11) In Paragraph 10, for example, the semiconductor device further includes the memory.

(12) In Paragraph 11, the control circuit, the test circuit, the test interface circuit and the memory, are formed on, for example, one semiconductor chip.

(13) In Paragraph 12, the control circuit, the test circuit, and the test interface circuit are formed on one semiconductor chip, and the memory is formed on other semiconductor chip; and the one semiconductor chip and the other semiconductor chip are mounted on a wiring board, electrically coupled to each other, and sealed with plastics. Since the wiring coupling the one semiconductor chip and the other semiconductor chip is susceptible to the effect of noise, and, when fail occurs due to noise, a plurality of pieces of fail-information can be obtained by the test circuit, thereby, it is possible to grasp the state of a fail due to noise and to perform a fail analysis.

(14) A semiconductor device according to the present invention includes a test circuit. The test circuit includes: a determination section for determining right/wrong of information obtained by memory access; and a memory section for holding specific fail-information among pieces of fail-information sequentially obtained in response to a wrong determination result, and for dividing serial two pieces of fail-information sequentially continuing from the specific fail-information into a plurality of groups to hold differences that are obtained for each corresponding group. Since differences in the serial two pieces of fail-information are held, it is possible to reduce the memory area of a test circuit required for storing fail-information. Furthermore, whether or not a partially coinciding part is present between pieces of fail-information from which difference is taken can be grasped for each group.

(15) In Paragraph 14, for example, the test circuit generates group information which defines correspondence of a difference in fail-information obtained by dividing it into groups and a corresponding group, and removes pieces of difference information of groups having zero difference from objects to be held. Therefore, the memory area required for storing fail-information can be reduced further. The groups removed from the objects to be held will be clear from group-information dropped by this procedure.

(16) In Paragraph 15, for example, the test circuit, when it obtains differences based on pieces of fail-information sequentially obtained with a wrong-determination result at the time of holding the specific fail-information as a base point, sequentially adds subsequent differences to the specific fail-information for each corresponding group to decompress subsequent pieces of fail-information.

(17) In Paragraph 16, for example, the test circuit, when it performs the decompression, matches objects to be added of each group based on the group information.

(18) A semiconductor device according to the present invention includes a test circuit and a test interface circuit for coupling the test circuit to a tester. The test circuit includes: a determination section (50) for determining right/wrong of information obtained by memory access; a first memory section (51) for holding fail-information responding to a wrong-determination result obtained by the determination section at a prescribed timing; a difference obtaining section (60) for sequentially obtaining differences in fail-information responding to continuing serial two wrong-determination results; and a second memory section (61) for holding difference information obtained by the difference obtaining section. Data input/output speed of the test interface circuit is slower than memory access speed by the test circuit. Since the second memory section as a memory area required for absorbing such speed difference holds differences in serial two pieces of fail-information, a required memory area can be reduced.

(19) In Paragraph 18, the test interface circuit is, for example, an IEEE1149.1 compliant TAP controller.

(20) In Paragraph 18, for example, the test circuit further includes a decompression section (62) for decompressing continuing pieces of fail-information by using fail-information of the first memory section and difference information of the second memory section.

(21) In Paragraph 20, for example, the difference obtaining section obtains differences based on fail-information sequentially obtained with a wrong-determination result at the time of holding the fail-information in the first memory section as a base point. For example, the decompression section sequentially adds subsequent differences to pieces of fail-information held by the first memory section to decompress subsequent pieces of fail-information.

2. Details of Embodiments

Embodiments will be described in detail further. Hereinafter, preferred embodiments of the present invention will be described in detail referring to the accompanying drawings. In all the drawings that illustrate the preferred embodiments, members with like functions are designated by like reference symbols and numerals and repeated descriptions thereof will be omitted.

Semiconductor Module

Figure 2:
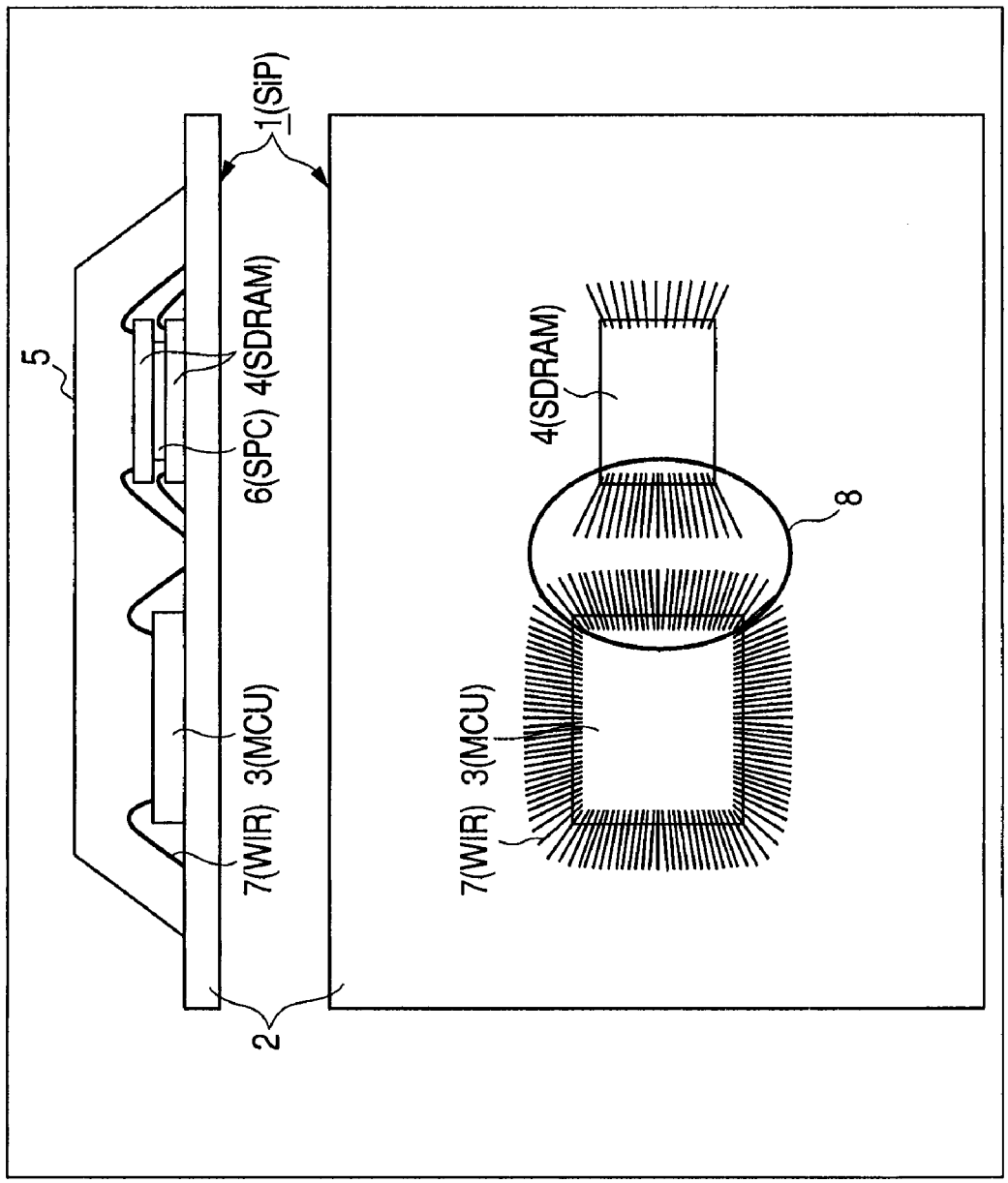
FIG. 2 is an explanatory diagram exemplifying a semiconductor module that is an example of a semiconductor device according to the present invention.

In FIG. 2, a semiconductor module that is an example of a semiconductor device according to the present invention, is exemplified. A semiconductor module 1 shown in the figure is constituted in a form of a SiP (system in package) where, on a module substrate 2 including a large number of external connection electrodes such as solder bump electrodes on the rear surface thereof and a wiring pattern formed on the top surface thereof, a microcomputer (MCU) 3 in a form of a SoC (system on chip) and an SDRAM (synchronous dynamic random access memory) 4 such as a DDR2 (double data rate 2) are mounted, and top surface of which is sealed with a plastic package (PKG) 5. Two SDRAMs 4 are laminated via a spacer (SPC) 6. The microcomputer 3 and the SDRAM 4 are formed on separate semiconductor chips, respectively, and they may be a bare chip or may be packaged. The microcomputer 3 and the SDRAM 4 are connected to corresponding wiring patterns by a wire (WIR) 7 such as a bonding wire. Signal wirings of data, an address and an access control signal which connect between the microcomputer 3 and the SDRAM 4, are commonly designated by reference numeral 8.

Figure 3:
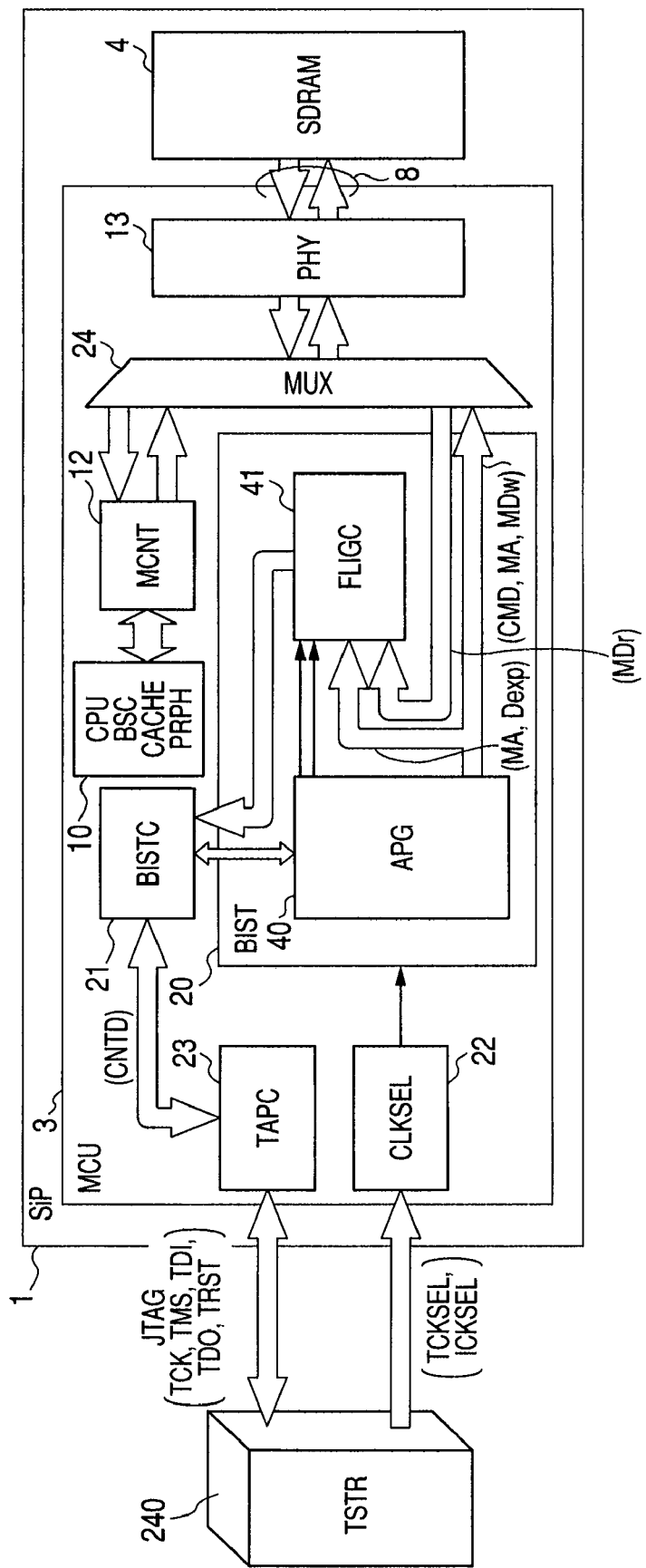
FIG. 3 is a block diagram of the semiconductor module.

In FIG. 3, functional blocks of the semiconductor module 1 are shown. Especially, a configuration of the microcomputer 3 for a memory test for the SDRAM 4 is shown here. Most configurations for achieving primary data processing functions by the microcomputer 3 are simplified and commonly designated by a circuit block 10. The circuit block 10 includes: a central processing unit (CPU) for fetching a command and executing it; a cache memory (CACHE) for holding frequently accessed data and a command so that they can be output by associative retrieval; a bus state controller (BSC) for controlling a bus depending on the address area to be accessed by the CPU etc.; a peripheral circuit (PRPH) such as a timer for connecting to the BSC via a peripheral bus; and the like. A memory controller (MCNT) 12 is one of peripheral circuits and a circuit for performing memory control for an external memory in response to an access request by the CPU etc. For example, the memory controller 12 performs address output control where address multiplexing synchronized with RAS (row address strobe) and CAS (column address strobe) for the SDRAM 4 is performed, command output control, refresh control, and the like. Especially, since, as the SDRAM 4, a form of a DDR2 is assumed here, where while being synchronized with edge changes of each data strobe, input/output of data is enabled, the memory controller 12 includes a physical interface circuit (PHY) 13 corresponding to the specification of a physical interface of the DDR2, and the SDRAM 4 is coupled to the memory controller 12 via the physical interface circuit 13. The physical interface circuit 13 is a circuit that satisfies the interface specification of a physical layer in the external interface of the SDRAM 4 in a form of a DDR2. For example, the physical interface circuit 13 of the SDRAM 4 in a form of a DDR2 includes circuits such as a circuit of the differential output of a clock signal, a circuit of the differential input/output for a data strobe signal, and a circuit for data input/output. The physical interface circuit for a SDRAM 4 in a form of a DDR is not required to perform the differential input/output of a data strobe signal. The configuration of a physical interface circuit is uniquely determined by the specification of an external memory to be used, thereby, for a SDRAM in a form of a DRAM or a SDR (single data rate), the physical interface circuit is only an external terminal.

In FIG. 3, a test circuit (BIST) 20, a test control circuit (BISTC) 21, a clock selection circuit (CLKSEL) 22, a TAP controller (TAPC) 23, and a multiplexer (MUX) 24 are incorporated to form a configuration in order to perform a self test to the SDRAM 4.

The multiplexer 24 is coupled to the physical interface circuit 13 so that the memory controller 12 and the test circuit 20 can be switched. The control of switching is performed by the test control circuit 21.

The TAP controller 23 has an externally interfacing function which is compliant to IEEE1149.1, and it is interfaced to an external tester (TSTR) 240 via a JTAG terminal and inputs/outputs a control signal and a test signal between itself and the test control circuit.

Figure 4:
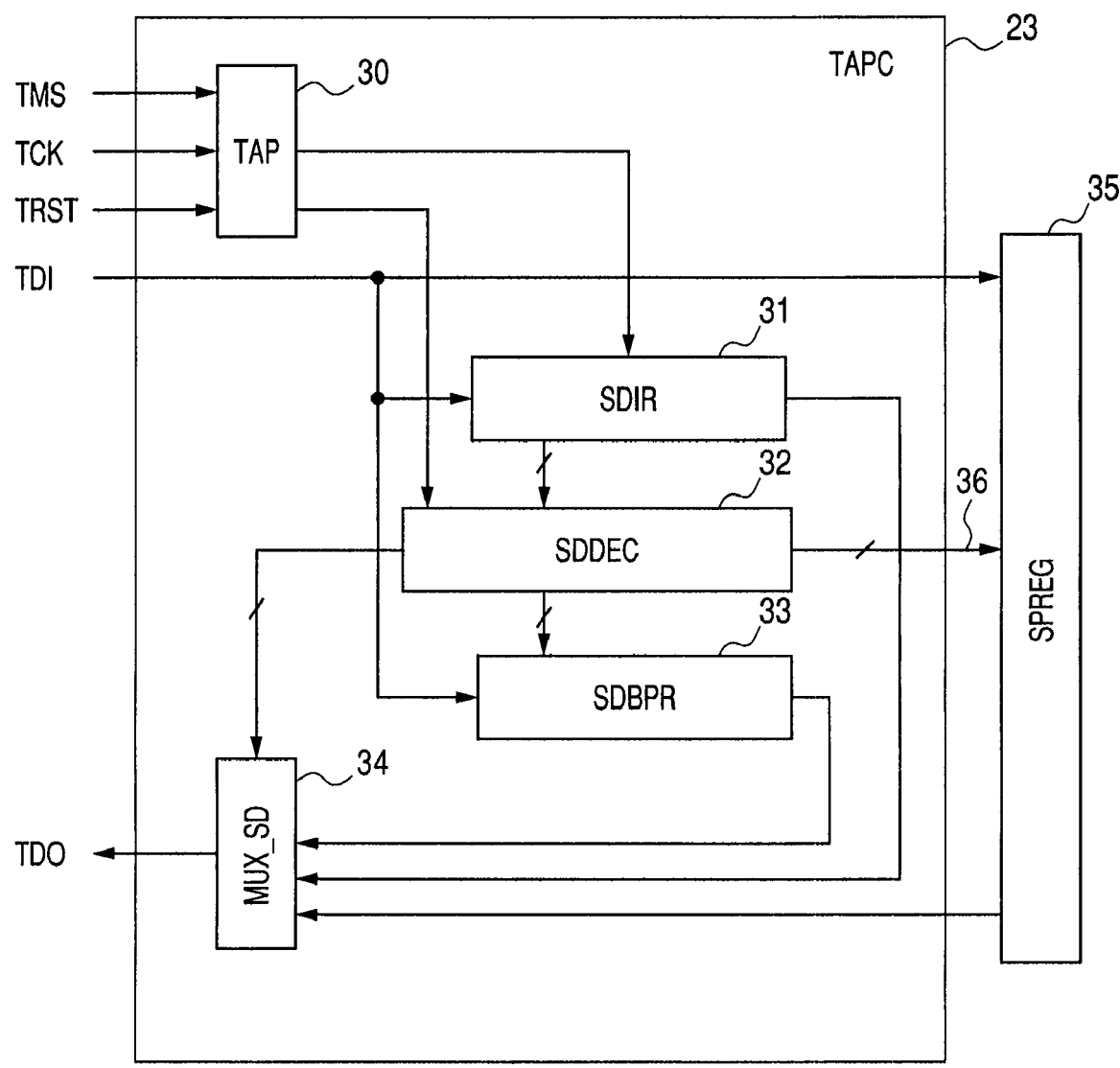
FIG. 4 is a block diagram showing a specific example of a TAP controller.

A specific configuration of the TAP controller 23 is exemplified in FIG. 4. The TAP controller 23 has a test access port (TAP) 30, a command register (SDIR) 31, a decoder (SD-DEC) 32, a bypass register (SDBPR) 33, and a multiplexer (MUX_SD) 34. The TAP controller 23 also has a mode terminal TMS, a clock terminal TCK, a reset terminal TRST, a data input terminal TDI, and a data output terminal TDO, totally resulting in 5 bits. When a memory test is performed, the terminals are connected to the tester 240. While being synchronized with a clock signal input into the clock terminal TCK, the TAP controller 23 takes data from the data input terminal TDI, and outputs data from the data output terminal TDO. By changing the value of the mode terminal TMS while synchronizing with the clock signal input into the clock terminal TCK, the type of the data input from the input terminal TDI can be determined. The protocol is compliant to the state transition specified by IEEE1149.1, and, according to the protocol, whether the input data is a command or data is determined. Between the data input terminal TDI and the data output terminal TDO, a scan-path register circuit (SPREG) 35 that is a series circuit of some scan registers is arranged. The scan-path register circuit 35 has a circuit configuration where a data register, a control register and the like which are arranged inside the test circuit 21 are connected in series in a form of a shift register in a prescribed order. The decoder 32 decodes a command input into the command register 31 to generate a BIST control signal 36. The BIST control signal 36 selects the scan paths and switches them, and selects whether the input data is a command or data. With the arrangement, data and control information can be set in the internal data register, the control register and the like which constitute the scan-path register circuit 35 inside the test circuit 21, from the data input terminal TDI, and a test result such as fail-information possessed by the data register can be taken out from the data output terminal TDO. Test operation of the test circuit 20, selection operation of the multiplexer 24, and selection operation of the clock selection circuit 22 are controlled according to the control information set in the control register inside the scan-path register 35. In addition, the bypass register 33 is a register for bypassing data input from the data input terminal TDI to the TDO. The multiplexer 24 selects a route to be connected to the data output terminal TDO.

The clock selection circuit 22 shown in FIG. 3 selects a synchronizing clock of the test circuit 20 from the tester 240 according to selection signals TCKSEL and ICKSEL. If the selection signal TCKSEL is enabled, the test circuit 20, while being synchronized with the test clock signal supplied to the clock terminal TCL, will be operated at a low speed. If the selection signal ICKSEL is enabled, the test circuit 20, while being synchronized with the system clock signal used for data processing operation of the microcomputer 3, will be operated at a high speed. The operation of the test circuit 20 synchronized with the system clock signal is, for example, an operation that, while performing reading/writing of the SDRAM 4, determines right/wrong (pass/fail) of the read data. The operation of the test circuit 20 synchronized with the test clock signal is, for example, an operation such as one for reading-out the fail-information according to the right/wrong-determination result obtained by the test circuit 20 on the tester 240 via the test control circuit 21 and the TAP controller 23.

The test circuit 20, as exemplified in FIG. 3, has a pattern generator (APG) 40 and a fail-information obtaining circuit (FLIGC) 41. If, a signal is provided from the tester 240 to the JTAG terminals (TCK, TMS, TDI, TDO, and TRST), the TAP controller 23 will send a control signal (CNTD) to the test control circuit 21, and, accordingly, the test circuit 20 will be started. With the arrangement, the pattern generator 40 generates a command (CMD), a memory address (MA), and data (MDw, Dexp) which control the SDRAM 4, to test the SDRAM 4 via the physical interface circuit 13. When issuing a write command, the APG 40 supplies memory write data MDw to the SDRAM 4 to write it thereon. When the APG 40 issues a read command, it supplies expectation value data Dexp to the fail-information obtaining circuit 41. Referring to the memory read-data MDr and the expectation value data Dexp which are read-out from the SDRAM 4, the fail-information obtaining circuit 41 performs determination of pass/pail, and obtains information according to the determination result.

Fail-Information Obtaining Circuit

In FIG. 1, a specific example of the fail-information obtaining circuit 41 is shown. The fail-information obtaining circuit 41 has a pass/fail-determination section (PFDET) 50, a specific fail-information storing section (FLInS) 51, and a plurality of pieces of fail-information obtaining section (PIPU) 52.

The pass/fail-determination section 50, when a comparison enable signal ENcmp is activated (at a high level), compares the memory read data MDr and the expectation value data Dexp. When the memory read data MDr and the expectation value data Dexp are different from each other, the pass/fail-determination section 50 outputs a high-level fail-flag FFLG. The memory read data MDr at the time when the comparison result is different is referred to as fail-data FMDr, and the corresponding memory address MA is referred to as a fail-address FMA. The fail-flag FFLG is latched by a flag latch (LATF) 59. Once the flag latch (LATF) 59 latches the fail-flag FFLG, it keeps the state until resetting is instructed by the test control circuit 21. The output of the flag latch (LATF) 59 is supplied to the test control circuit 21 as a pass/fail-signal PS/FL.

The specific fail-information storing section 51 has a latch circuit (LATD) 53 for latching one piece of fail-data FMDr, and the latch circuit (LATA) 54 for latching one fail-address FMA corresponding to the data. A fail counter (FLCUNT) 55 which outputs a count-up signal when the number of cases of occurrence of a high-level fail-flag reaches a preset value, and a latch enable generation circuit (LTENG) 56 which generates a latch enable pulse ENlat in response to the count-up signal, are provided so that the latch circuits 53 and 54 may latch fail-data and fail-address of any fail point. If an analysis mode signal MDan is activated, the preset value is set to one, and when the fail-flag FLFLG is activated for the first time, the latch enable pulse ENlat is generated so that the latch circuit 53 latches the first fail-data (1stFMDr) and the latch circuit 54 latches the first fail-address (1stFMA). The reset instructions to the latch circuits 53 and 54 are given from the test control circuit 21. In addition, when the analysis mode signal MDan is not activated, the test control circuit 21 is enabled to preset an arbitrary value into the fail counter 55.

The specific fail-information obtaining section 52 includes: a difference obtaining circuit (DIFG) 60; a difference information storing register (DIFReg) 61; and a decompression circuit (DECMP) 62. When an analysis mode signal MDan is activated, the difference obtaining circuit 60 obtains a difference in fail-data (FMDr) and a difference in fail-address (FMA) between continuing two serial data, respectively. The obtained differences are stored in the difference information storing register 61. Pieces of difference information stored in the difference information storing register 61 are sequentially read-out into the decompression circuit 62. The decompression circuit 62 sequentially adds each of the subsequent differences to the first pieces of fail-information 1stFMGr and 1stFMA to decompress the subsequent pieces of fail-information. The decompressed fail-information FLI is supplied to the test control circuit 21. In addition, when the analysis mode signal MDan is not activated, the pieces of fail-information FMA and FMDr which are latched by the latch circuits 53 and 54 are directly supplied to the test control circuit 21 as the fail-information FLI.

Figure 5:
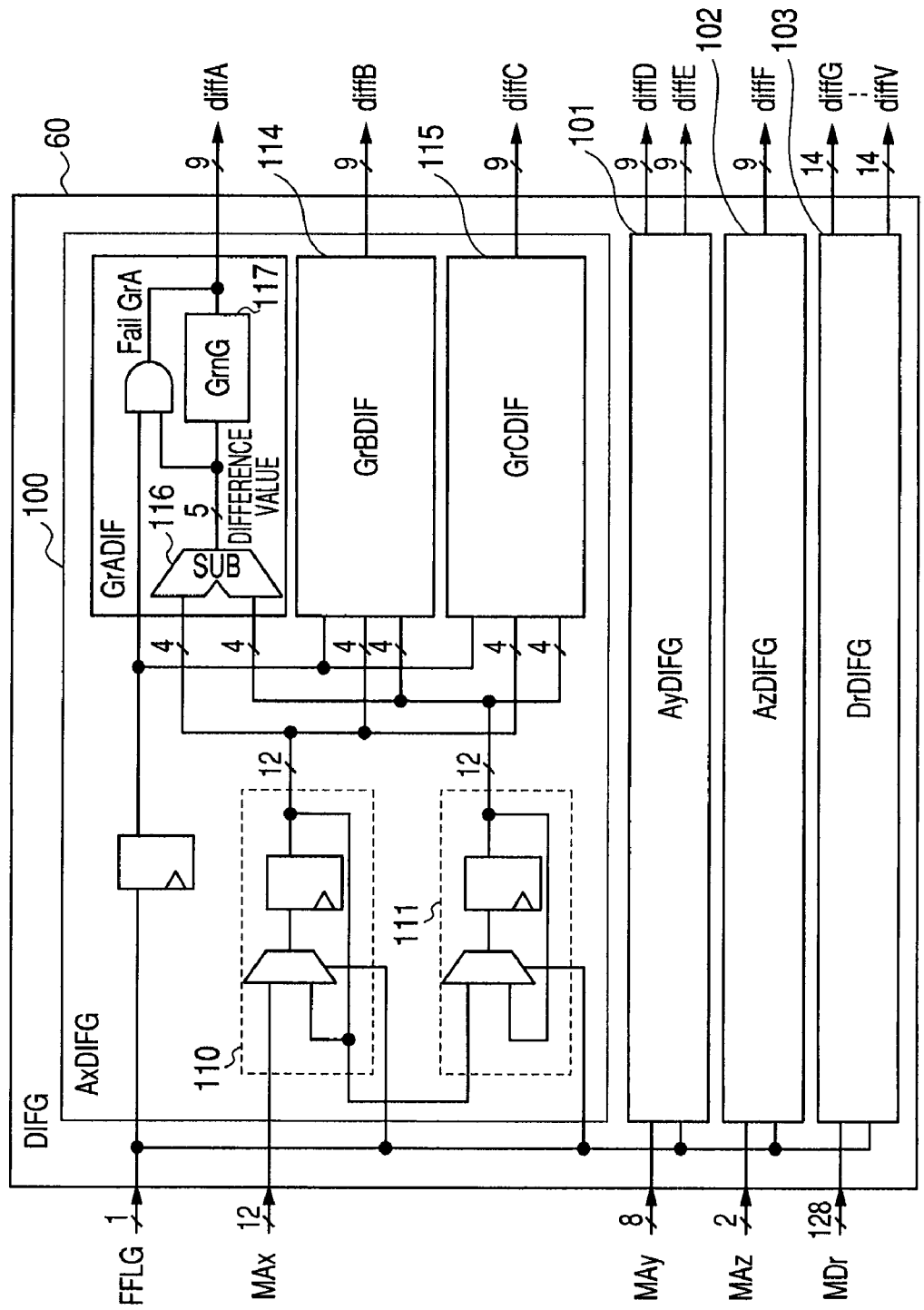
FIG. 5 is a block diagram showing a specific example of a difference obtaining circuit.

In FIG. 5, a specific example of the difference obtaining section 60 is shown. Here, a case of bus configuration constituted by a memory address MA having a 12 bits of x memory-address MAx, an eight bits of y memory-address MAy, and a two bits of z memory-address MAz, and 128 bits of memory data MDr, will be described. The difference obtaining section 60 is made up of an x fail-address difference obtaining section (AxDIFG) 100, a y fail-address difference obtaining section (AyDIFG) 101, a z fail-address difference obtaining section (AzDIFG) 102, and a fail-data difference obtaining section (DrDIFG) 103.

The x fail-address difference obtaining section 100 has an n-th x fail-address latch 110 and an (n−1)-th x fail-address latch 111 in a form of a shift register where two stages are connected in series, and, when a fail occurs, holds serial two fail-addresses by using them, and the held fail-addresses are divided into groups of four bits, respectively. Difference circuits (GrADIF, GrBDIF and GrCDIF) 113, 114 and 115 are provided for each divided group. The difference of a fail-address of each divided group is calculated by a subtractor (SUB) 116. The total bits of the calculated difference are made five bits including a one bit of sign bit. To the difference of each of the groups, a one bit of fail-flag Fail_GrA which indicates whether or not a difference is present for each group, and four bits of group identification information are added. As exemplified by the difference circuit 113, to the group fail-flag Fail_GrA, unless the difference is zero for all bits (if a difference is present in the group), the logic value of the fail-flag FFLG at that time (logic value of one) is provided, if the difference is zero for all bits (if a difference is not present in the group), logic value of zero is provided. The group identification information is added by a group identification information adding circuit (GrnG) 117. Here, since group information is separately provided for addresses and data, and the addresses are divided into six groups, group identification information of an address is caused to have three bits. The difference circuit 113 outputs a five bits of difference value, a one bit of group fail-flag, and three bits of group identification information, that is total nine bits of difference information diffA. Similarly, the difference circuits 114 and 115 generate nine bits of difference information diffB and diffC and output it, respectively.

The y fail-address difference obtaining section 101 and the z fail-address difference obtaining section 102 are also constituted similarly to the x fail-address difference obtaining section 100. The y fail-address difference obtaining section 101 generates two groups of separate pieces of difference information diffD and diffE, and the z fail-address difference obtaining section 102 generates difference information diffF without separating it into groups.

The fail-data difference obtaining section 103 is also constituted similarly to the above mentioned manner, it divides 128 bits of fail-data into 16 groups in eights of bits, and each group outputs 14 bits of difference information diffG to diffV, respectively, which includes a nine bits of difference value, a one bit of group fail-flag, and four bits of group identification information.

The difference obtaining section 60 has a function to obtain the difference between n-th and (n−1)-th fail-information and to accumulate only fail-information of groups where a difference is present. The purpose of this is to make the amount of information to be accumulated small by taking difference, because when a fail due to noise etc. occurs, fails may occur continuously from an address where the fail occurred. As a method for obtaining a difference, other than the method for obtaining a difference between n-th and (n−1)-th fail-information, there is also a method for always taking difference between n-th information and the first fail-information (1stFMDr and 1stFMA). However, in this case, the difference value changes largely, and thereby, the amount of information to be accumulated will be large. By taking a difference between adjacent fail-addresses, the amount of information to be accumulated can be reduced largely. Moreover, although, there is also a method for accumulating fail-information without dividing it into groups, information for all bits should be always accumulated, and thereby, the circuit scale will be larger than that of a case where fail-information is divided.

The effect of reducing the circuit scale by dividing into groups will be described. In an example, a case is exemplified, where an address (x, y, z) is moved from (0, 0, 0) to (99, 0, 0) by +1, and data [7: 0] fails every time. Under the conditions, if fail-information is directly accumulated (without taking difference and without dividing it into groups), data amount of fail-addresses will be 2200 bits (=22 bits (total bits of addresses)×100 (number of fails)). Data amount of fail-data will be 12800 bits (=128 bits (data width)×100 (number of fails)). Total sum of the data amount will be 15000 bits (=2200 bits+12800 bits). On the other hands, if the present invention is applied (a difference is obtained, and fail-information is divided into groups), data amount of fail-addresses will be 967 bits (=22 bits (1stFMA)+9 bits (1 group)×(99+6) (number of fails)). Data amount of fail-data will be 1514 bits (=128 bits (1stFMDr)+14 bits (1 group)×99 (number of fails)). Total sum of the data amount will be 2481 bits (=967 bits+1514 bits). Based on the results, if the number of gates (G) of a register for holding one bit is set to four, the number of register gates before being applied with the present invention will be 60000 (=15000×4), and the number of register gates after being applied with the present invention will be 9924 (=2481×4), thereby, the circuit scale can be reduced to be approximately ⅙. In addition, "the number of fails (99+6)" at the time of obtaining the data amount of the fail-addresses can be obtained by the following consideration. In other words, if x-addresses (12 bits) are divided into three groups of [11:8], [7:4], and [3:0], when the x-addresses fail continuously from 0 to 99, that is 12'b000000000000 to 12'b000001100011, the group of [3:0] will fail 99 times because it fails every time, the group of [7:4] will fail 6 times because it fails every 16 times, and the group of [11:8] will not fail because it does not change. Therefore, total number of the fails will be (99+6).

In a memory test, generation factors of fails or tendency of fail contents may differ largely between addresses and data, thereby, in considering this fact, by performing the above mentioned grouping separately for addresses and data, generation factors of a difference in each group will not present in both of the address group and the data group, and as a result, it is enabled to prevent the amount of fail-information to be accumulated from being large uselessly.

Figure 6:
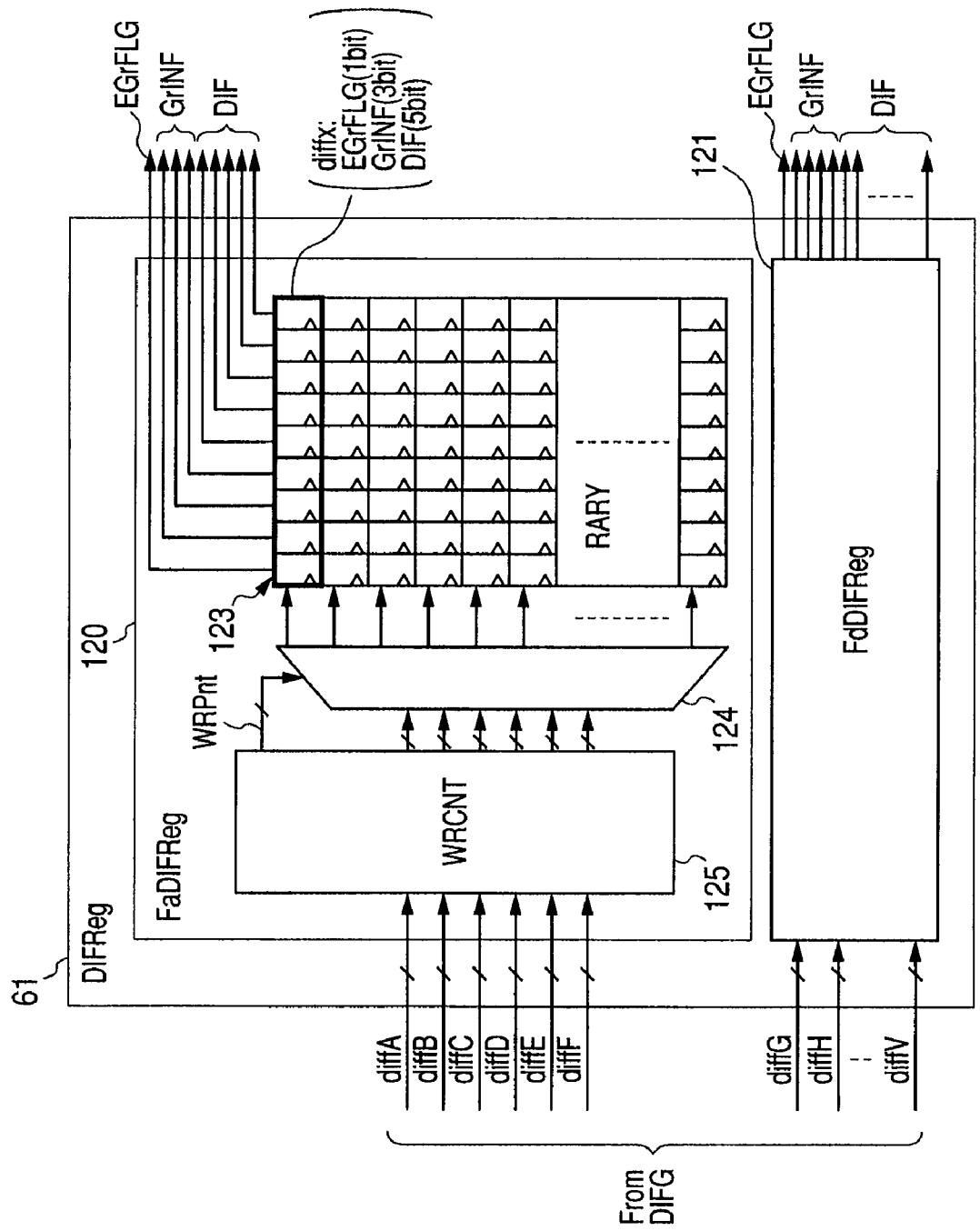
FIG. 6 is a block diagram showing a specific example of a difference information storing register.

In FIG. 6, a specific example of the difference information storing register 61 is shown. The difference information storing register 61 has a fail-address storing section (FaDIFReg) 120 and a fail-data storing section (FdDIFReg) 121.

The fail-address storing section 120 has a register array (RARY) 123, a register selector 124, and a writing control circuit (WRCNT) 125. The writing control circuit 125 where pieces of address difference information diffA to diffF are input, performs generation of a write pointer address WRPnt for writing the pieces of difference information in the register array 123, rearrangement of the pieces of difference information diffA to diffF to be written according to the write pointer address WRPnt, and addition of the last group flag EGrFLG for identifying the last group where a difference is present. The rearrangement of the difference information is defined as an operation where, the group fail-flag (Fail_GrA) for each group is referred to each pieces of the difference information diffA to diffF, and difference information having group fail-flag of zero is moved to the last part of the arrangement of pieces of difference information. Therefore, the difference information having a group fail-flag of zero, that is difference information having no difference, is arranged to the back of pieces of difference information having a group fail-flag of one, that is difference information having a difference. The last group flag EGrFLG is added to the top of pieces of difference information, and the last group flag EGrFLG of the last group having a difference is set to H (logic value of one or a high level). For one fail-address, a range of difference information to the range where the last group flag is set to H, becomes the arrangement of pieces of information having a difference. The write pointer address points the first address on which difference information is written, and the register selector 124 selects a register so as to write the pieces of difference information diffA to diffF that are six groups of difference information from the first address, on a register array 123 simultaneously. At that time, the value of the next write pointer address is updated so that difference information having no difference is overwritten. Accordingly, the difference information of a group having a difference will be held on the register array finally, thereby, the register can be prevented from being uselessly used for holding the difference information of a group having no difference, in this point, it is also possible to contribute to reduction of memory capacity. When difference information is read-out from the register array 123 after testing, the register array 123 is switched to a shift register operation mode so that the last group flag (EGrFLG), group information (GrINF), and a difference value (DIF), can be read-out sequentially and in parallel, for each difference information. Although, detailed illustration is eliminated in the figure, the fail-data storing section (FdDIFReg) 121 is also constituted as above.

Figure 7:
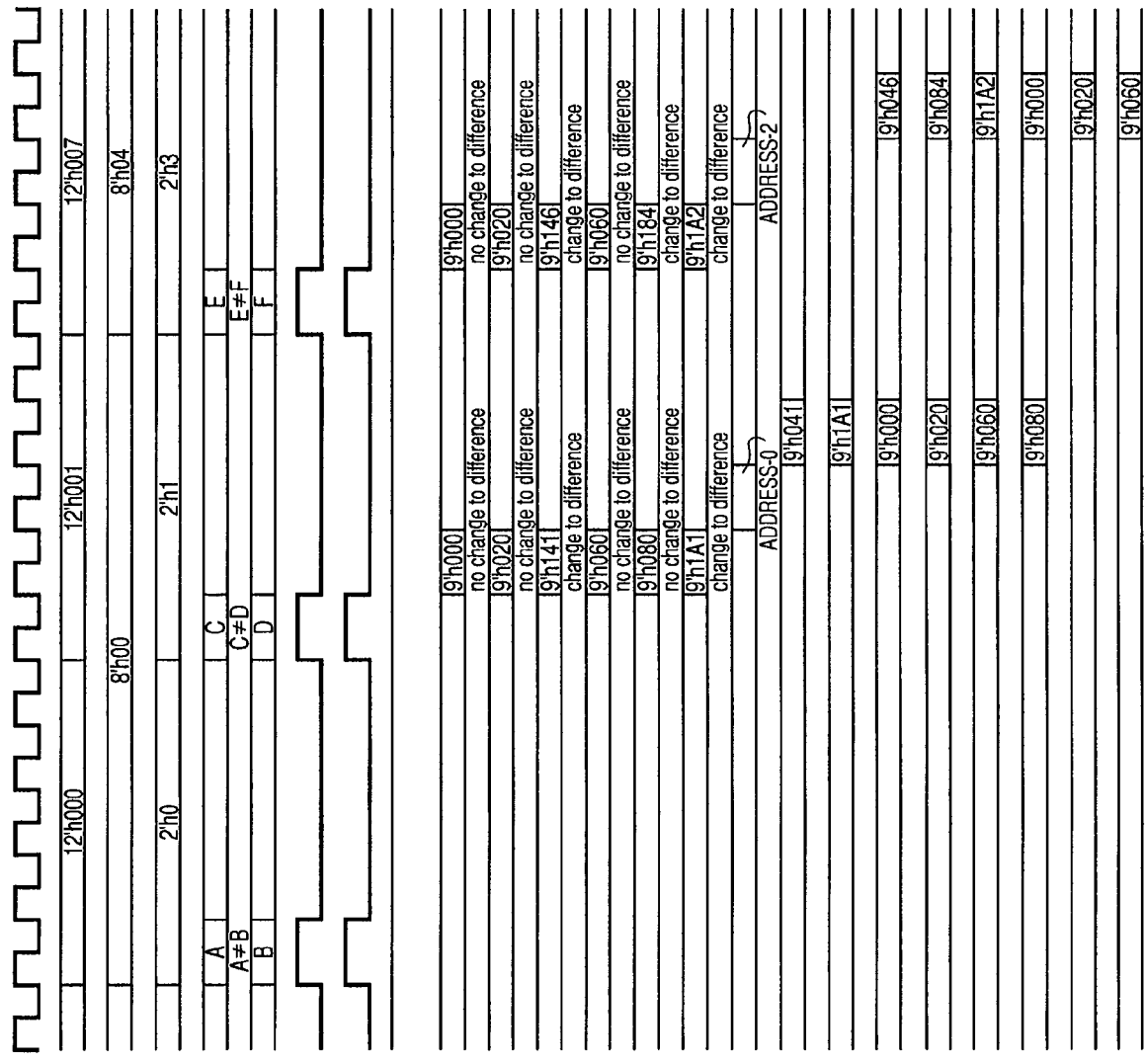
FIG. 7 is a timing chart exemplifying an operation timing at the time of obtaining a fail address.

In FIG. 7, a timing waveform at the time of obtaining a fail-address is exemplified. In the figure, a waveform is shown in a case where a first fail is occurred at (x, y, z)=(0, 0, 0), a second fail is occurred at (x, y, z)=(1, 0, 1), and a third fail is occurred at (x, y, z)=(7, 4, 3). During a period where comparison enable signal ENcmp is set H (high level), read data MDr and an expectation value Dexp are compared, that is, data A and data B, data C and data D, and data E and data F, are compared in cases of (x, y, z)=(0, 0, 0), (x, y, z)=(1, 0, 1), and (x, y, z)=(7, 4, 3), respectively, and since all of the results are inconsistent, the fail-flag FFLG is set H. If the fail-flag FFLG is set H for the second time, difference values diffA to diffF of each group will be output from the difference obtaining circuit 60 at the next clock. In this case, since there is change to difference in the difference values diffC and diffF, the following formulas will be satisfied: diffC =9'h141 and diffF=9'h1A1. Next, in the register array (RARY) 123, 0th-address of the write pointer address WRPnt is generated, rearrangement of the groups is performed by giving preference to groups having change to difference value. Since the most significant bit of difference information is set to the last group flag, the difference information diffC of the group C is set to 9'h041, and the difference information diffF of the group F is set to 9'h1A1. After that, pieces of difference information of six groups are stored in the register array 123. Similarly, when a third fail-flag is set to H, difference information diffC, diffE and diffF has change to difference, thereby, rearrangement of fail groups and addition of the last group flag are performed, and the difference information thereof is written on an address subsequent to 2nd-address (RARY#2) having no change to difference information yet. In other words, with regard to difference information within a range of (a) corresponding to a case where the fail-flag is set to H for the second time, the pieces of difference information of six addresses are written in the register array 123 regardless of having change or not to difference, and if next fail will occur, the corresponding difference information is overwritten in the register array 123 from the 2nd-address having no change to difference yet. With regard to difference information within a range of (b) corresponding to a case where the fail-flag is set to H for the third time, six pieces of difference information are written in the register array 123 with the 2nd-address having no change to difference at the time of occurrence of the 2nd fail as a base point, and if next fail will occur, the corresponding difference information is overwritten in the register array 123 from the 5th-address having no change to difference yet.

Figure 8:
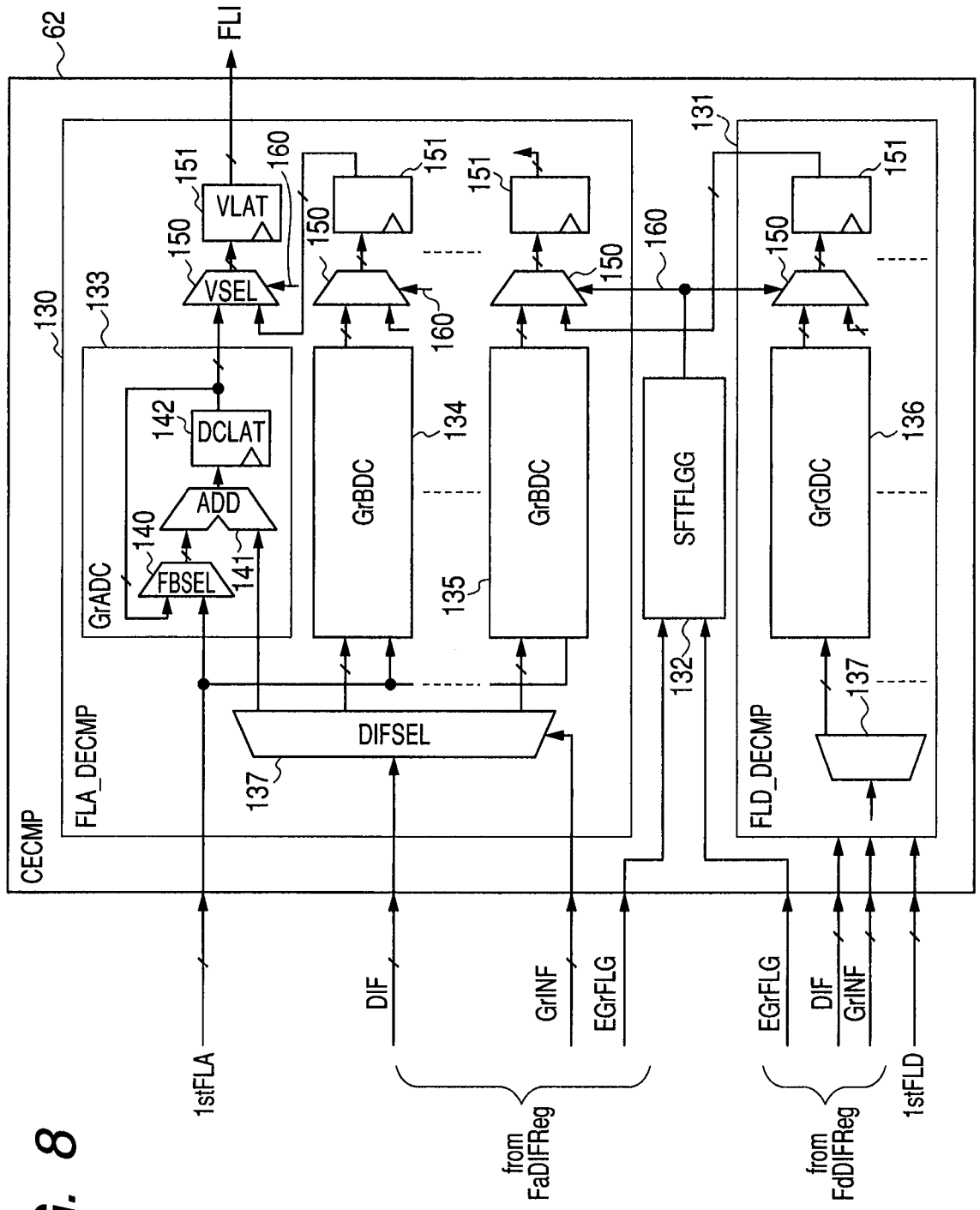
FIG. 8 is a block diagram showing a specific example of a decompression circuit.

In FIG. 8, a specific example of the decompression circuit 62 is shown. The decompression circuit 62 is a circuit for reading-out difference information from the difference-value storing register 61 after a test to decompress fail-information. The decompression circuit 62 has a fail-address decompression circuit (FLA_DECMP) 130, a fail-data decompression circuit (FLD_DECMP) 131, and a shift flag generation circuit (SFTFLGG) 132.

The fail-address decompression circuit 130 has decompression sections (GrADC to GrFDC) 133 to 135 for each group according to difference information of addresses, and the fail-data decompression circuit 131 has decompression sections (GrGDC to GrVDC) 136 for each group according to difference information of data. A difference value selector (DIFSEL) 137 supplies a difference value DIF to a decompression section specified by group information GrINF. The decompression sections (GrADC to GrFDC) 133 to 135, at the 1st cycle of a decompression operation, by adding a first fail-address 1stFLA and a difference value DIF which are selected by a feed back selector (FBSEL) 140 using an adding circuit (ADD) 141 to hold it to a latch circuit (DCLAT) 142, and, at a cycle subsequent to the 2nd cycle of the decompression operation, by adding the adding value of the latch circuit (DCLAT) 142 selected by the feed back selector (FBSEL) 140 and the next difference value DIF to rewrite the adding value of the latch circuit (DCLAT) 142, can perform cumulative addition. The decompression sections (GrGDC to GrVDC) 136 also function similarly. To each output of the decompression sections 133 to 135 and 136, a selector (VSEL) 150 and a latch circuit (VLAT) 151 are connected in series. A shift flag generating circuit 132, if both of the last group flag EGrFLG of fail-address difference information according to one fail and the last group flag EGrFLG of fail-data difference information are set to H, activates a shift flag (SFTFLG) 160, and connects the latch circuits (VLAT) 151 in series by the selector 150 to switch its configuration to the configuration of a shift register.

Decompression operation by the decompression circuit 62 is performed for each group, where, firstly, difference values are added to the first fail-address (1stFMA) and the first fail-data (1stFMDr), and the second fail-address and the second fail-data are decompressed. The last group flags EGrFLG of the fail-address and the fail-data are input into the shift flag generating circuit 132, and if both last group flags are H, one fail will be decompressed and the latch circuits (VLAT) 151 are switched to have the configuration of a shift register, and fail-information is output to the test control circuit 21. After that, by repeating the procedure, all pieces of fail-information stored in the difference-value storing register 61 are decompressed and output into the test control circuit 21.

Figure 9:
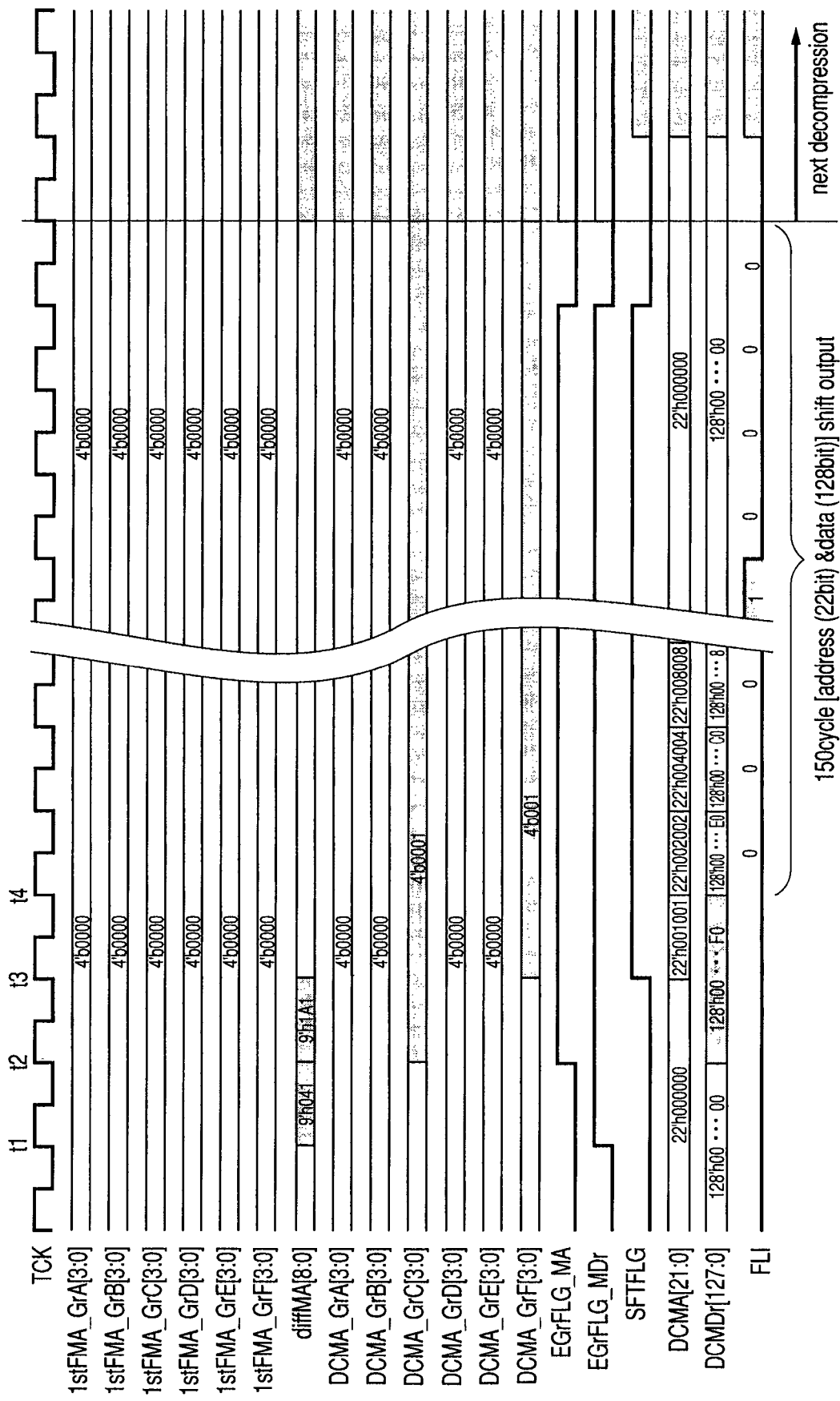
FIG. 9 is a timing chart exemplifying a fail-information decompression operation.

In FIG. 9, a fail-information decompression timing waveform is shown. In the figure, in a case where a first fail is occurred at (x, y, z)=(0, 0, 0), and a second fail is occurred at (x, y, z)=(1, 0, 1), a decompressed waveform with respect to the second fail is shown. Here, by assuming that data is also decompressed simultaneously, decompression of fail-addresses will be described mainly. It is assumed that only one fail group of data is present and decompressed data is 128'h000000000000000000000000000000F0.

If difference information 9'h041 is read by the fail-address difference value storing register 120 at a timing of time t1, in the decompression circuit 62, the decompression circuit (GrCDC) of group C is selected, the difference value is added to the first fail-address, and the decompression address of group C will be 4'b0001. Similarly, from difference information 9'h1A1 read-out by the difference-value storing register 120 at time t2, the decompression circuit (GrFDC) of group F is selected, and the decompression address of group F will also be 4'b0001. At that time, the last fail-address group flag EGrFLG becomes H, and the shift flag (SFTFLG) 160 will be H at time t3. Then, the registers 151 of decompression addresses and decompression data are switched to have the configuration of a shift register at time t4, and thereby, total 150 bits of information that is a sum of pieces of information of addresses (22 bits) and data (128 bits) is output from the data terminal TDO to the tester 240 via the test control circuit 21 and the TAP controller 23. Upon completion of shift output, next fail-information will be decompressed. This procedure is repeated, and all pieces of fail-information are output to the tester 240. In FIG. 1, 1stFMA_GrA is the address information on group A of the first fail-address; diffMA is the difference values of addresses; DCMA_GrA is the decompressed address of group A; EGrFLG_MA is the last group flag with regard to a fail-address; EGrFLG_MDr is the last group flag with regard to fail-data; DCMA is decompressed addresses; and DCMDr is decompressed data.

Figure 10:
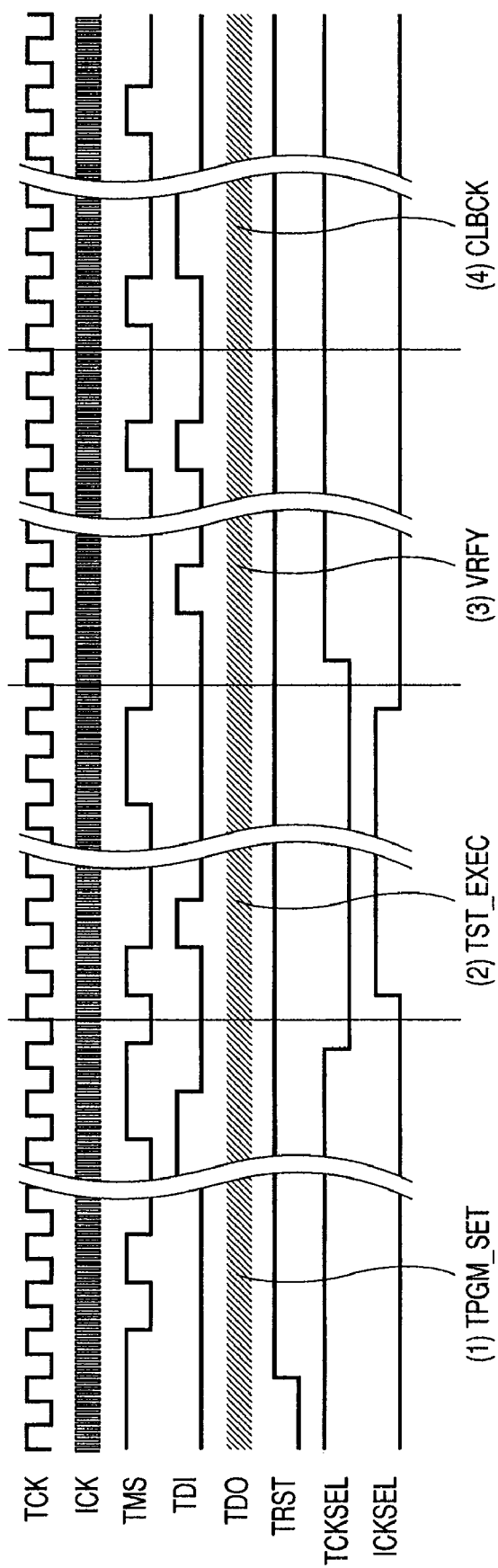
FIG. 10 is a timing chart showing a waveform of an external signal at the time of a memory test.

In FIG. 10, a waveform of an external signal at the time of a memory test is exemplified. Control with respect to a test circuit 20 is performed by using JTAG terminals (TCK, TMS, TDI, TDO, and TRST) and clock switching signals (TCKSEL and ICKSEL). TRST is a low enable terminal. Until obtaining fail-information, there are four steps of: (1) setting a test program (TPGM_SET); (2) executing a test (TST_EXEC) by the test circuit 20; (3) verifying a test result (VRFY); and (4) calling back fail-information (CLBCK). At step (1) of setting a test program, the test program is loaded on a register inside the test circuit 20 with a low-speed external clock (a clock input into the terminal TCK). At step (2) of executing a test, the clock is switched into a high-speed internal clock (ICK), and SDRAM 4 is tested at the same speed as that of an actual access control operation by the memory controller 12 with respect to the SDRAM 4. At that time, when fail occurred, fail-information is held by the fail-information obtaining circuit 41 of the test circuit 20. At step (3) of verifying a test result, the clock is switched to the low-speed external clock (the clock input into the terminal TCK) again, and whether the test result of SDRAM is passed or failed is verified. Finally, at step (4) of calling back fail-information, the obtained fail-information is output from the terminal TDO one bit at a time, and a plurality of pieces of fail-information is obtained.

Like the example of packaging described in FIG. 2, when a microcomputer 3 of SoC and an SDRAM 4 are mounted flatly on one package 5, since wires of a part 8, connecting between the microcomputer 3 and the SDRAM 4 are long, the semiconductor device is easily influenced by noise. Therefore, when fail due to noise is occurred, by obtaining a plurality of pieces of fail-information using the above-mentioned test circuit having a BIST structure, a state of the fail due to noise can be grasped, enabling to perform fail analysis.

Since, by adopting the above-described test circuit 20, a plurality of pieces of fail-information (of addresses and data) can be obtained by one test, even when the fail point changes for each measurement due to noise etc., fail causes can be easily separated by information of distribution of fail-addresses and the plurality of pieces of information of fail-data.

In a memory test, since an address is moved while being incremented or decremented by +1, by taking difference with respect to the former fail value, information to be accumulated can be reduced.

By dividing fail address and fail data into a plurality of groups each having a specified bit width, and by accumulating only groups having a change, data capacity necessary for obtaining a plurality of pieces of fail information can be compressed, enabling the circuit scale to be reduced.

The invention made by the present inventors has been so far described in reference to preferred embodiments thereof. However, the invention is not limited thereto and it is obvious that these details may be modified in various ways without departing from the spirit and scope of the invention.

Figure 11:
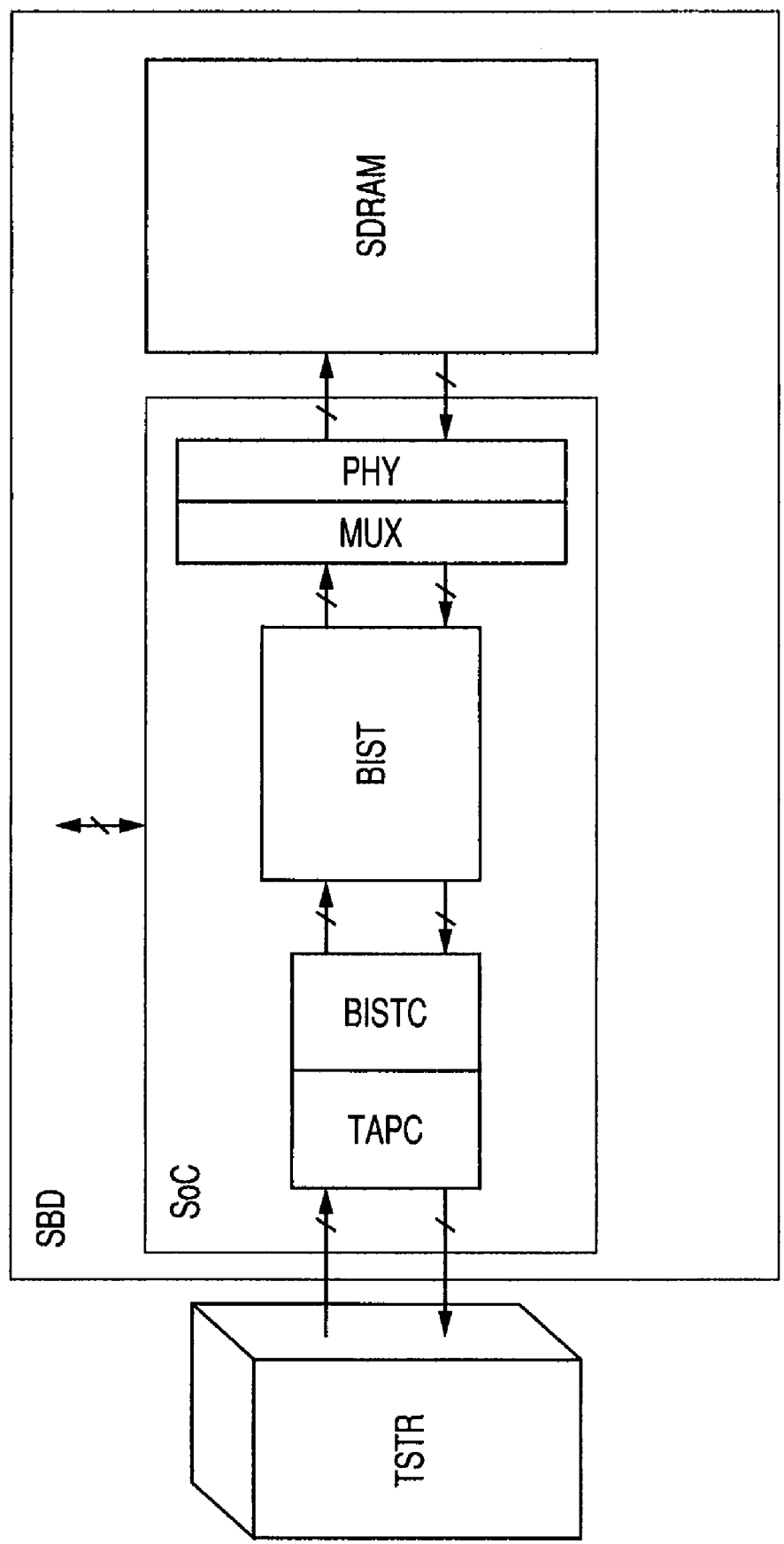
FIG. 11 is a schematic explanatory diagram showing an example of the present invention, where an SoC such as a microcomputer and a memory such as an SDRAM are mounted on a system board in a form of multi-chips.
Figure 12:
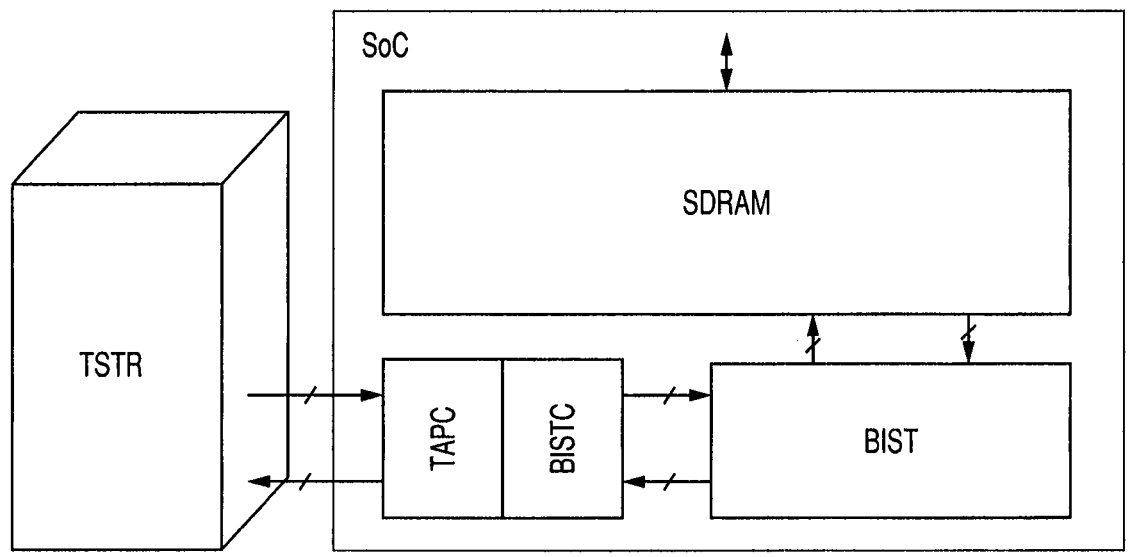
FIG. 12 is a schematic explanatory diagram showing an example of the present invention, where a memory to be tested such as an SDRAM, a test circuit and the other circuits are mounted together on a single semiconductor chip.
Figure 13:
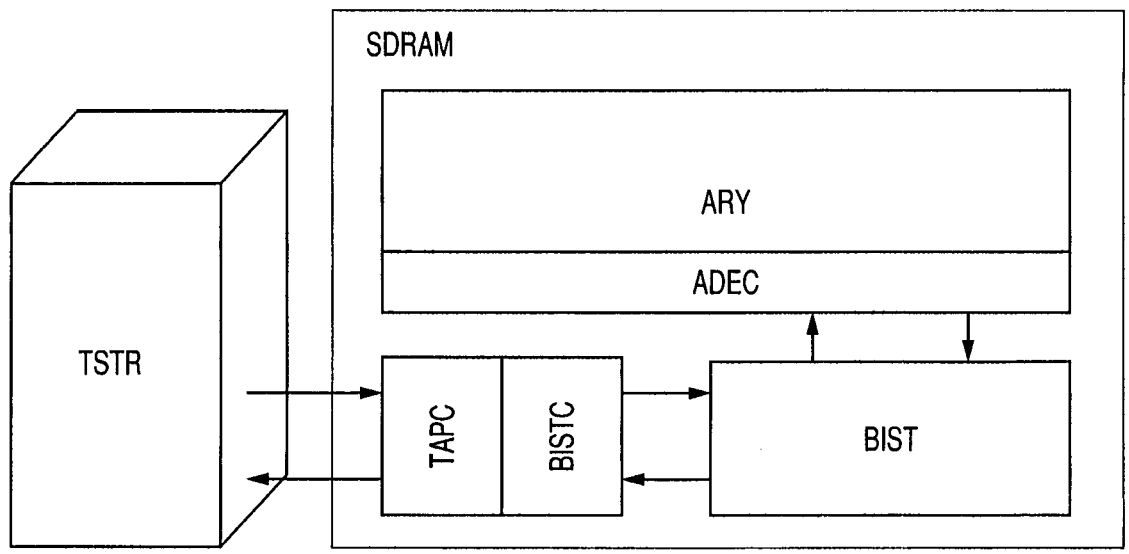
FIG. 13 is a schematic explanatory diagram showing an example where the present invention is applied to a memory device such as an SDRAM.
Figure 14:
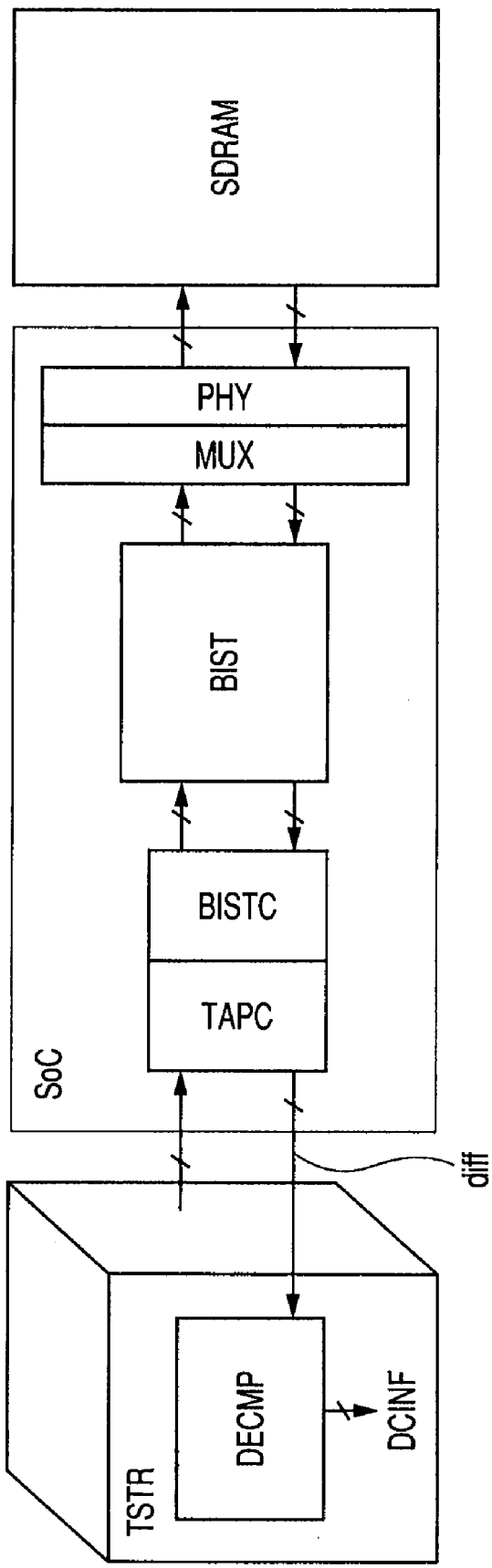
FIG. 14 is a schematic explanatory diagram showing an example of the present invention, where the function of a decompression circuit (DECMP) is achieved by a tester (TSTR) without providing a decompression circuit (DECMP) of a test circuit BIST.

For example, the semiconductor device is not limited to a SiP as shown in FIG. 3, instead, as exemplified in FIG. 11, the present invention is also applicable even to a semiconductor device where a SoC such as a microcomputer and a memory such as a SDRAM are mounted on a system board (SBD) on which various semiconductor devices are mounted. Moreover, as exemplified in FIG. 12, the present invention is also applicable to a semiconductor device such as a SoC where a memory to be tested such as a SDRAM, a test circuit BIST, and the other circuits are mounted together on a single semiconductor chip. Further, the semiconductor device is not limited to the SoC including a data processing function by a CPU, instead, as exemplified in FIG. 13, the present invention is also applicable to a memory device such as a SDRAM, and the test circuit BIST tests a memory cell array (ARY) via an address decoder (ADEC) etc., as a testing object. Moreover, as exemplified in FIG. 14, the test circuit BIST may not include a decompression circuit (DECMP). In this case, the function of the decompression circuit (DECMP) is achieved by, for example, a tester (TSTR), the test circuit BIST supplies difference information diff to the tester (TSTR), and the decompression circuit (DECMP) generates decompression information (DEINF). The testing object is not limited to the SDRAM, instead, various kinds of memories Such as a DRAM, a SRAM (Static RAM), a flash memory, an MRAM (Magnetoresistive RAM), and an EEPROM (Electrically Erasable Programmable Read Only Memory) can be a testing object. As an external interface for the tester, an interface other than the IEEE1149.1 complaiant TAP cotroller can also be used.

What is claimed is:

1. A semiconductor device comprising a test circuit,
wherein the test circuit determines right/wrong of information obtained by memory access; and holds specific fail-information among pieces of fail information sequentially obtained in response to a wrong-determination result and differences in fail-information between two serial pieces of fail-information sequentially continuing from the fail-specific information.

2. The semiconductor device according to claim 1,
wherein the test circuit, when it obtains differences based on pieces of fail-information sequentially obtained with a wrong-determination result at the time of holding the specific fail-information as a base point, sequentially adds subsequent differences to the specific fail-information to decompress subsequent pieces of fail-information.

3. The semiconductor device according to claim 1,
wherein the fail-information includes memory data read from a memory and memory addresses corresponding to the data.

4. The semiconductor device according to claim 3,
wherein the test circuit separates the memory data and memory addresses included in the fail-information; and obtains differences between the fail-information.

5. The semiconductor device according to claim 4,
wherein the test circuit divides the memory data and memory addresses included in two serial pieces of fail-information sequentially continuing from the specific fail-information into a plurality of groups, respectively, and obtains and holds differences between the fail-information for each corresponding group.

6. The semiconductor device according to claim 5,
wherein the test circuit generates group information which defines correspondence of the differences between the fail-information obtained by dividing it into groups and the groups, and removes difference information of groups having zero difference from objects to be held.

7. The semiconductor device according to claim 6,
wherein the test circuit, when it obtains differences based on pieces of fail information sequentially obtained with a wrong-determination result at the time of holding the specific fail-information as a base point, sequentially adds subsequent differences to the specific fail-information for each corresponding group to decompress subsequent pieces of fail-information.

8. The semiconductor device according to claim 7,
wherein the test circuit, when it performs the decompression, matches objects to be added of each group based on the group information.

9. The semiconductor device according to claim 1, further comprising a test interface circuit for coupling the test circuit to a tester,
wherein data input/output speed of the test interface circuit is slower than memory access speed by the test circuit.

10. The semiconductor device according to claim 9, further comprising a control circuit for accessing a memory.

11. The semiconductor device according to claim 10, further comprising the memory.

12. The semiconductor device according to claim 11,
wherein the control circuit, the test circuit, the test interface circuit and the memory are formed on one semiconductor chip.

13. The semiconductor device according to claim 12,
wherein the control circuit, the test circuit, and the test interface circuit are formed on one semiconductor chip, and the memory is formed on other semiconductor chip; and the one semiconductor chip and the other semiconductor chip are mounted on a wiring board, electrically coupled to each other, and sealed with a resin.

14. A semiconductor device comprising a test circuit,
wherein the test circuit includes: a determination section for determining right/wrong of information obtained by memory access; and a memory section for holding specific fail-information among pieces of fail-information sequentially obtained in response to a wrong-determination result, and for dividing serial two pieces of fail-information sequentially continuing from the specific fail-information into a plurality of groups to hold differences obtained for each corresponding group.

15. The semiconductor device according to claim 14,
wherein the test circuit generates group information which defines correspondence of a difference in fail-information obtained by dividing it into groups and a corresponding group, and removes pieces of difference information of groups having zero difference from objects to be held.

16. The semiconductor device according to claim 15,
wherein the test circuit, when it obtains differences based on pieces of fail-information sequentially obtained with a wrong-determination result at the time of holding the specific fail-information as a base point, sequentially adds subsequent differences to the specific fail-information for each corresponding group to decompress subsequent pieces of fail-information.

17. The semiconductor device according to claim 16,
wherein the test circuit, when it performs the decompression, matches objects to be added of each group based on the group information.

18. A semiconductor device comprising a test circuit and a test interface circuit for coupling the test circuit to a tester,
wherein the test circuit includes: a determination section for determining right/wrong of information obtained by memory access; a first memory section for holding fail-information responding to a wrong-determination result obtained by the determination section at a prescribed timing; a difference obtaining section for sequentially obtaining differences in fail-information responding to continuing serial two wrong-determination results; and a second memory section for holding the difference information obtained by the difference obtaining section; and
wherein data input/output speed of the test interface circuit is slower than memory access speed by the test circuit.

19. The semiconductor device according to claim 18,
wherein the test interface circuit is an IEEE1149.1 compliant TAP controller.

20. The semiconductor device according to claim 18,
wherein the test circuit further includes a decompression section for decompressing continuing pieces of fail-information using fail-information of the first memory section and difference information of the second memory section.

21. The semiconductor device according to claim 20,
wherein the difference obtaining section obtains differences based on fail-information sequentially obtained with a wrong-determination result at the time of holding the fail-information in the first memory section as a base point; and
wherein the decompression section sequentially adds subsequent differences to pieces of fail-information held by the first memory section to decompress subsequent pieces of fail-information.

* * * * *